United States Patent [19]

Lu et al.

[11] Patent Number: 5,683,946
[45] Date of Patent: Nov. 4, 1997

[54] METHOD FOR MANUFACTURING FLUORINATED GATE OXIDE LAYER

[75] Inventors: Wei-Shin Lu; Jenn-Gwo Hwu, both of Taipei, Taiwan

[73] Assignee: National Science Counsil, Taipei, Taiwan

[21] Appl. No.: 565,982

[22] Filed: Dec. 1, 1995

[51] Int. Cl.$^6$ .................................................. H01L 21/02
[52] U.S. Cl. .......................... 437/235; 437/238; 437/241; 437/242
[58] Field of Search ............................ 437/235, 238, 437/241, 242

[56] References Cited

U.S. PATENT DOCUMENTS

| 5,334,552 | 8/1994 | Homma | 437/238 |
| 5,468,682 | 11/1995 | Homma | 437/195 |
| 5,571,576 | 11/1996 | Qian et al. | 427/574 |

Primary Examiner—John Niebling
Assistant Examiner—Long Pham
Attorney, Agent, or Firm—Madson & Metcalf

[57] ABSTRACT

A method for manufacturing a gate oxide layer containing fluorine is disclosed. The method includes steps of providing a substrate; depositing a fluorinated oxide layer over said substrate; and oxidizing said fluorinated oxide layer at a high temperature. The fluorinated oxide layer according to the present invention exhibits good properties in radiation hardness, hot carrier resistance and breakdown endurance. Thus, it is an excellent method for easily and cost-effectively manufacturing reliable and consistent wafers.

20 Claims, 7 Drawing Sheets

METHOD FOR MANUFACTURING FLUORINATED GATE OXIDE LAYER

BACKGROUND OF INVENTION

The present invention relates to semiconductor integrated circuits and their manufacture. More particularly, the invention relates to a technique for forming a fluorinated gate oxide layer. But it will be recognized that the invention has a wider range of applicability. Merely by way of example, the invention may be applied in the manufacture of other semiconductor devices and other oxide layers.

Industry utilizes or has proposed techniques for fabrication of a fluorinated gate oxide layer. Fabrication steps generally include adding a proper amount of fluorine atoms into the oxide layer for forming a fluorinated oxide layer, which has properties such as resistance to hot carrier stressing and high breakdown field endurance, but with excess fluorine atoms, oxide charge traps and interface traps problem can also arise.

One conventional method for forming fluorinated gate oxide is to immerse the silicon wafer in HF, and then place the wafer in the processor to form a fluorinated gate oxide layer. The disadvantage of this method is that the fluorine content is very hard to control.

Another conventional method is to implant fluorine atoms into the polycrystalline silicon gate, then to drive-in the fluorine atoms by a high temperature treatment. The drawback of the method lies in that for thin oxide layer (thickness less than 100 Å), a large amount of fluorine will pass through the oxide layer.

Yet another method is to place the wafer in an oxygen ambient containing $NF_3$ to form a fluorinated gate oxide layer by a rapid thermal oxidation. The disadvantage of this method is that $NF_3$ may decompose into fluorine ions, thereby corroding quartz robe and causing contamination.

From the above it is seen that a method of fabricating a fluorinated gate oxide layer which is easy, reliable, consistent, and cost effective is often desired.

SUMMARY OF THE INVENTION

One objective of the present invention is to provide a method for manufacturing fluorinated gate oxide layer, the method can easily control the fluorine content.

Another objective of the present invention is to provide a method for manufacturing fluorinated gate oxide layer, the method will not cause a large amount of fluorine pass through the oxide (even when the oxide layer is a very thin one) and contamination.

Yet another objective of the present invention is to provide a method for fabricating a fluorinated gate oxide easily, reliably, consistently, and cost-effectively.

In a specific embodiment, the present invention provides a method of fabricating a fluorinated gate oxide layer. The method includes providing a substrate, depositing a fluorinated oxide layer over the substrate, and oxidizing the fluorinated oxide layer at a high temperature. The method can further include a step of flushing the substrate by RCA solution before the depositing step. The method can further include a step of lowering the temperature of the wafer after the oxidizing step. The method can further include a step of dipping the substrate in pure water after the depositing step.

Certainly, the depositing step can be achieved by liquid phase deposition. The liquid phase deposition can be achieved by immersing the substrate in a solution of oversaturated $H_2SiF_6$. The over-saturated $H_2SiF_6$ can be obtained by adding water into a solution of saturated $H_2SiF_6$, or by adding boric acid into a solution of saturated $H_2SiF_6$. Aluminum can be added into the solution of over-saturated $H_2SiF_6$, thereby adding aluminum atoms into the fluorinated oxide layer.

Certainly, the depositing step can be at a temperature of 20° C. to 100° C. The oxidizing step can be in a rapid thermal processor or in a quartz tube of a resistive furnace. The high temperature can be over about 800° C. The oxidizing step can be in an oxygen ambient or an $N_2O$ ambient.

In an alternative specific embodiment, the present method includes providing a substrate, growing a fluorinated oxide layer over the substrate by liquid phase deposition, and heating the wafer in a processor at a high temperature, thereby oxidizing the fluorinated oxide layer. The method can further includes a step of flushing the substrate by RCA solution before the growing step. The method can further include steps of lowering the temperature of the processor, and taking out the wafer from the processor. The method can further include a step of dipping said substrate in pure water after said growing step.

Certainly, the growing step can be at a temperature of 20° C. to 100° C. The high temperature can be over about 800° C. The oxidizing step can be in an $O_2$ or $N_2O$ ambient. The processor can be a rapid thermal processor.

The present invention achieves these benefits in the context of known process technology. However, a further understanding of the nature and advantages of the present invention may be realized by reference to the latter portions of the specification and attached drawings.

DETAILED DESCRIPTION OF THE INVENTION

According to the present invention, a method for manufacturing a fluorinated oxide layer includes steps of providing a substrate, depositing a fluorinated oxide layer over the substrate, and oxidizing the fluorinated oxide layer at a high temperature. The method can further include a step of flushing the substrate by RCA solution before the depositing step. The method can further include a step of lowering the temperature of the wafer after the oxidizing step. The method can further include a step of dipping the substrate in pure water after the depositing step.

Figure 1:
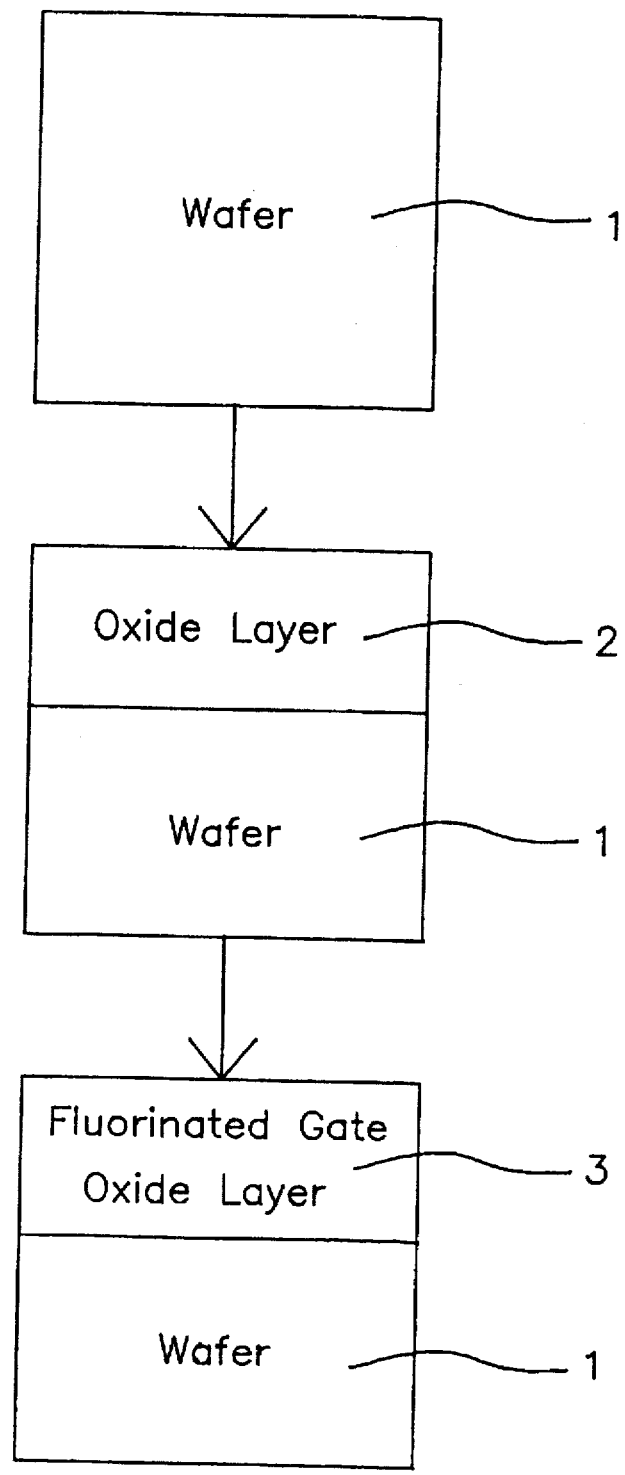
FIG. 1 is a simplified process flow of one preferred embodiment according to the present invention.

FIG. 1 is a simplified process flow of one preferred embodiment according to the present invention. The embodiment includes the following steps:

(1) preparing a wafer 1, and cleaning it with RCA solution;

(2) immersing the wafer in a solution of over-saturated $H_2SiF_6$ for executing a liquid phase deposition procedure, thereby forming a very thin oxide layer 2 containing fluorine (fluorinated oxide layer) on the wafer in a temperature range of 20° C. to 100° C.;

(3) dipping the wafer in pure water;

(4) placing the wafer in a rapid thermal processor and heating the wafer up to over about 800° C. in an $O_2$ or $N_2O$ ambient for executing an oxidizing procedure of the fluorinated oxide layer 2, thereby forming a fluorinated gate oxide layer 3; and (5) lowering temperature of the processor and taking out the wafer from the processor.

Details of the present method are described by way of the following Figures. The method illustrated is merely an example, and should not be construed as limiting the scope of the claims herein.

Figure 2:
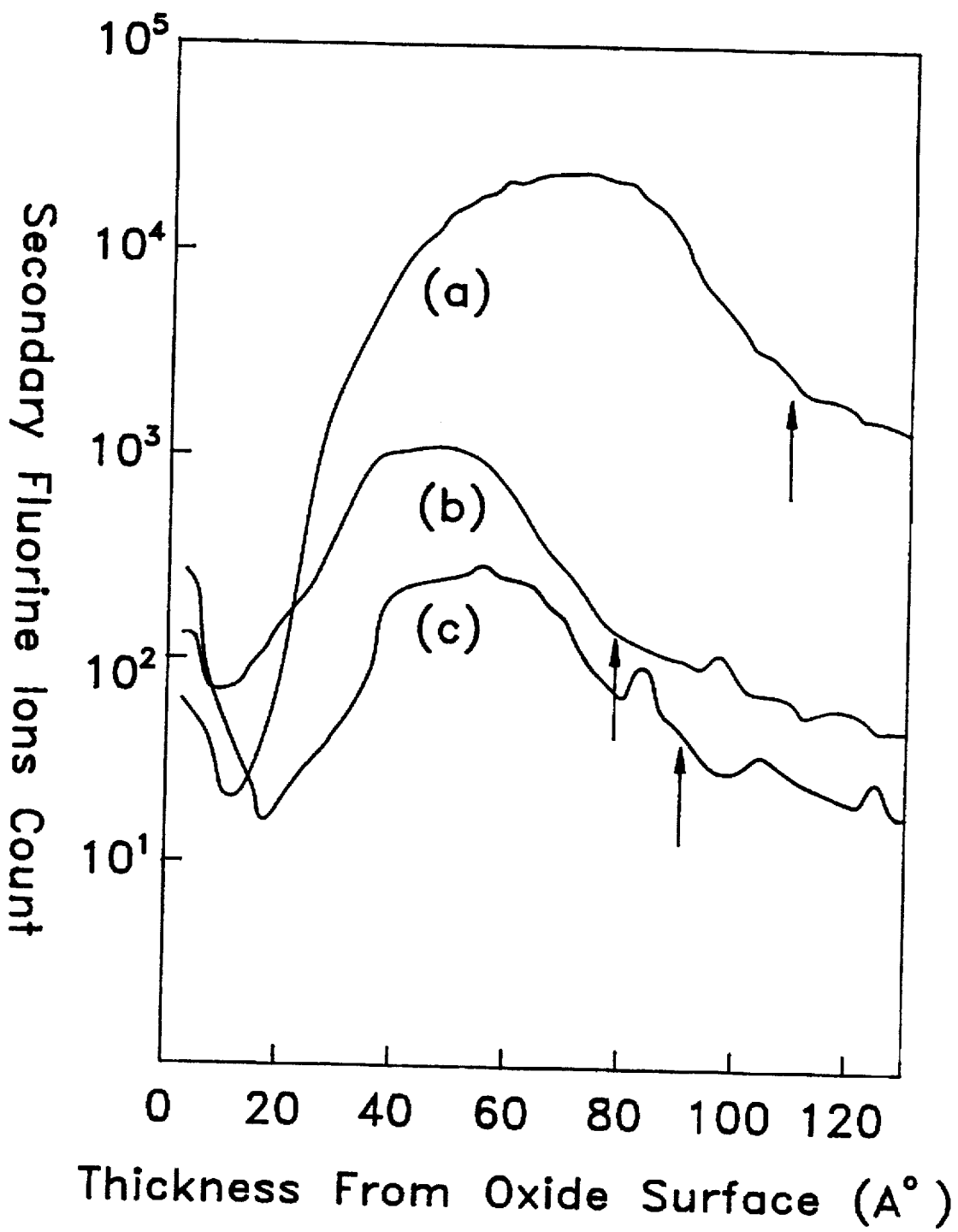
FIG. 2 shows the relation between secondary fluorine ions count and thickness from oxide surface according to the present invention.

Referring to FIG. 2, line (a) shows the relation between secondary fluorine ions count and thickness from oxide surface for the wafer processed by 56 minutes liquid phase deposition at 30° C. and 90 seconds rapid thermal oxidation; line (b) shows the relation between secondary fluorine ions count and thickness from oxide surface for the wafer processed by 45 minutes liquid phase deposition at 30° C. and 90 seconds rapid thermal oxidation; and line (c) shows the relation between secondary fluorine ions count and thickness from oxide surface for the wafer processed by 45 minutes liquid phase deposition at 30° C. and 150 seconds rapid thermal oxidation. Besides, the arrows indicates the interface between wafer surface and fluorinated oxide layer.

In lines (b) and (c), time for liquid phase deposition ($t_{LPD}$) are fixed, and time for rapid thermal oxidation ($t_{RTO}$) are varied. From the above two lines, it can be observed that the longer $t_{RTO}$, the less fluorine content. Whereas, fixing $t_{RTO}$ and varying $t_{LPD}$, we can observe from lines (a) and (b) that the longer $t_{LPD}$, the more the fluorine content. Therefore, it is understood that fluorine content can be easily controlled by controlling time for liquid phase deposition and time for rapid thermal oxidation.

Figure 3:
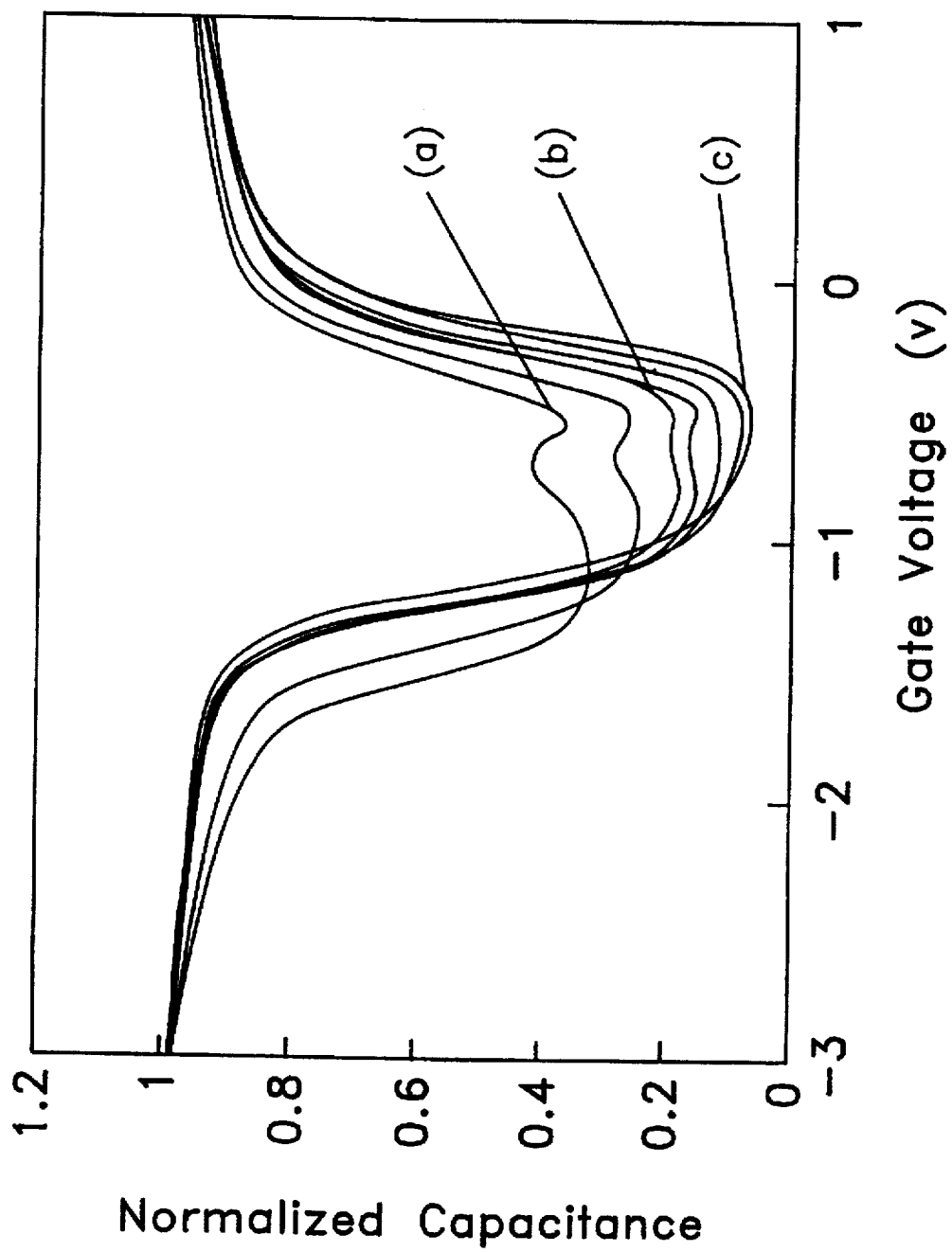
FIG. 3 shows the relation between normalized capacitance and gate voltage according to the present invention.

As shown in FIG. 3, line (a) shows the relation between normalized capacitance and gate voltage for the wafer processed by 76 minutes liquid phase deposition, 90 seconds rapid thermal oxidation at 950° C. in $O_2$ ambient, and 1 mega rads cobalt-60 radiation; line (b) shows the relation between normalized capacitance and gate voltage for the wafer processed by 56 minutes liquid phase deposition, 90 seconds rapid thermal oxidation at 950° C. in $O_2$ ambient, and 1 mega rads cobalt-60 radiation; and line (c) shows the relation between normalized capacitance and gate voltage for the wafer processed by 30 minutes liquid phase deposition, 90 seconds rapid thermal oxidation at 950° C. in $O_2$ ambient, and 1 mega rads cobalt-60 radiation.

It can be noticed that a proper amount of fluorine content can enhance the radiation hardness. Whereas, with the increasing fluorine content, the relation between normalized capacitance and gate voltage distorts very seriously.

Figure 4A:
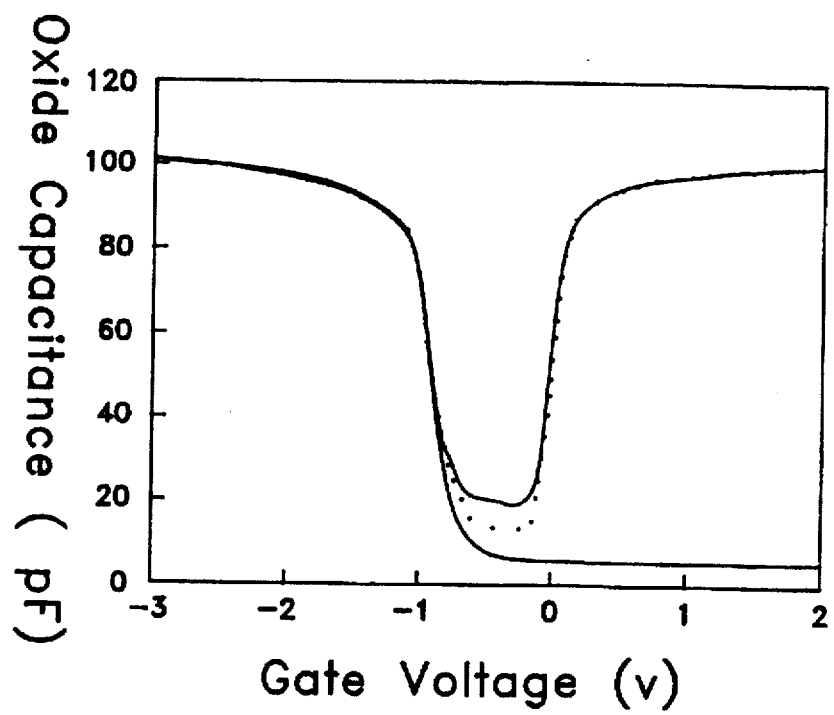
FIGS. 4 shows the relation between oxide capacitance and gate voltage according to the present invention.

FIG. 4(a) shows the relations between oxide capacitance and gate voltage for the wafers processed by rapid thermal oxidation in $N_2O$ ambient to form 100 Å fluorinated oxide layer, wherein one is before cobalt-60 radiation and the other is after cobalt-60 radiation.

Figure 4B:
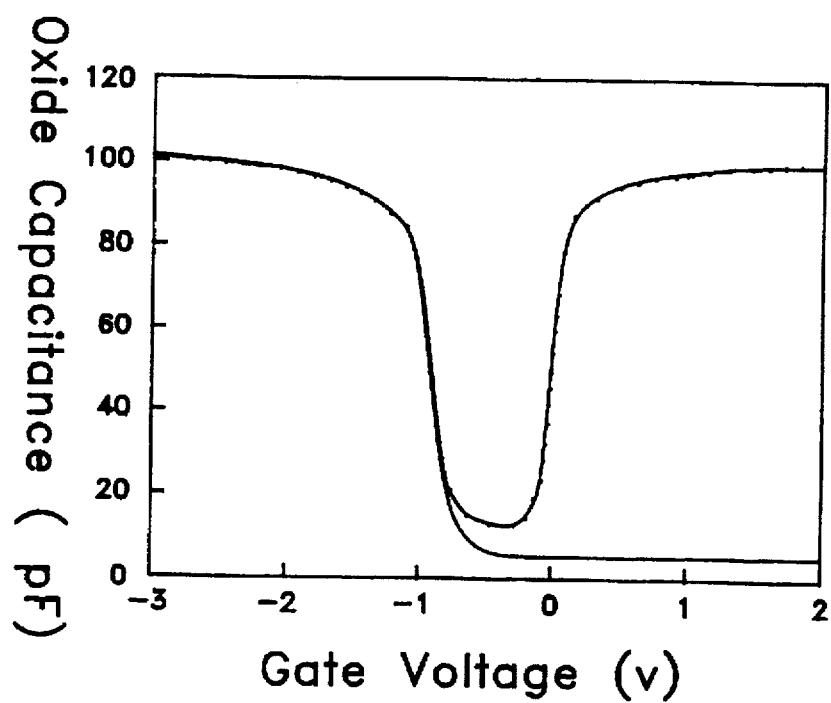

FIG. 4(b) shows the relations between oxide capacitance and gate voltage for the wafers processed by liquid phase deposition and rapid thermal oxidation in $N_2O$ ambient for forming 100 Å fluorinated oxide layer, wherein one is before cobalt-60 radiation and the other is after cobalt-60 radiation.

In FIG. 4(a), before and after radiation, the charge number density shift is $0.9 \times 10^{11}$ cm$^2$, and in FIG. 4(b), before and after radiation, the charge number density shift is $0.5 \times 10^{11}$ cm$^2$. Further, in FIG. 4(a), before and after radiation, the interface trap density shift is $9.0 \times 10^{10}$ eV$^{-1}$cm$^{-2}$, and in FIG. 4(b), before and after radiation, the interface trap density shift is $0.9 \times 10^{10}$ eV$^{-1}$cm$^{-2}$.

In comparison with FIG. 4(a) and FIG. 4(b), it can be learned that the fluorinated oxide layer resulting from the process of liquid phase deposition and then rapid thermal oxidization in $N_2O$ ambient has better radiation hardness than that resulting from the process of only rapid thermal oxidization in $N_2O$ ambient.

Figure 5:
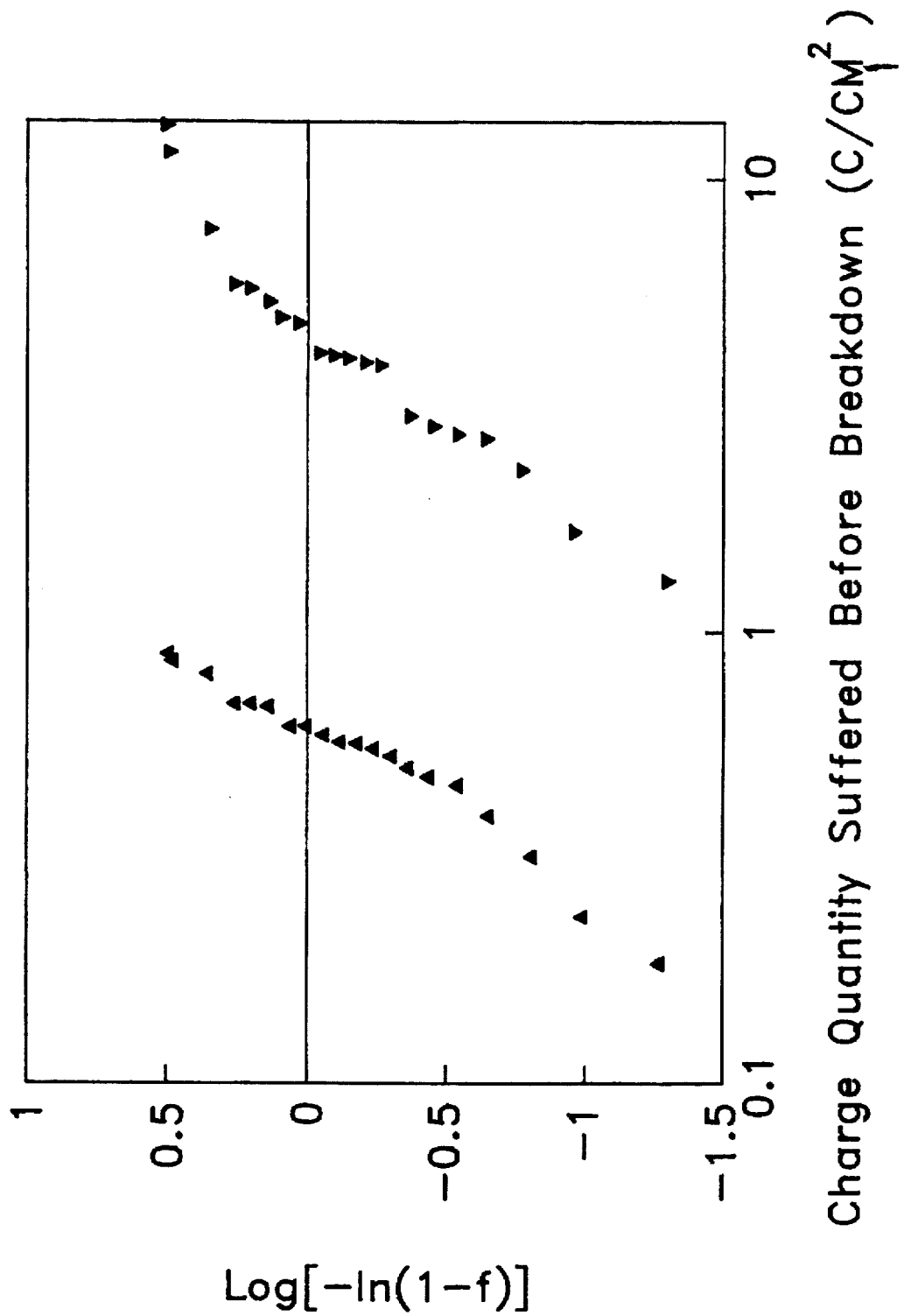
FIG. 5 illustrates the curve of Log[−ln(1−F)] of charge to breakdown according to the present invention.
Figure 6:
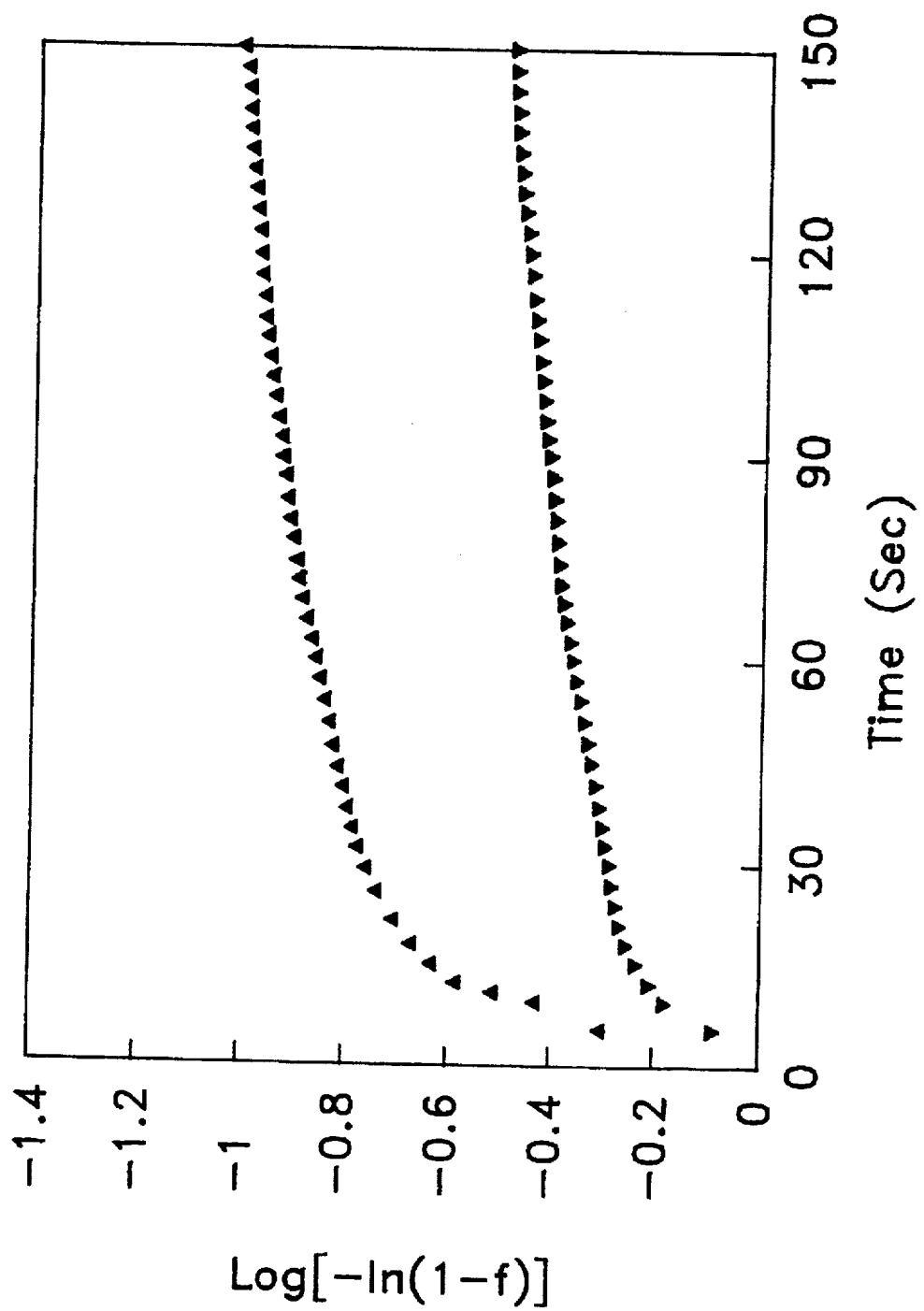
FIG. 6 illustrates the relation between gate voltage shift and constant current stress time according to the present invention.
Figure 7:
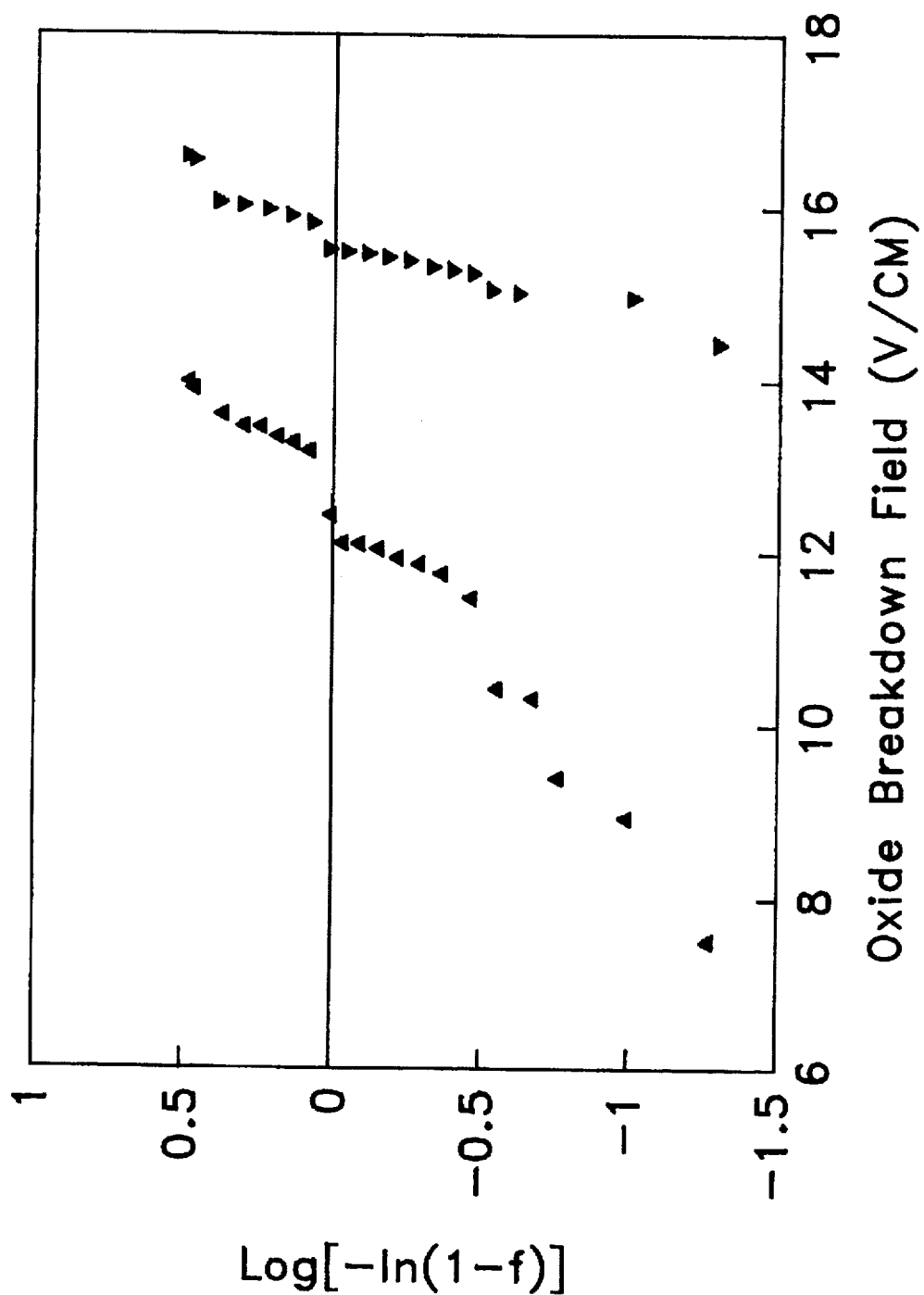
FIG. 7 illustrates the curve of Log[−ln(1−F)] of oxide breakdown field according to the present invention.

In FIGS. 5, 6 and 7, ▼ indicates the layer resulting from the process of liquid phase deposition and then rapid thermal oxidization in $N_2O$ ambient; and ▲ indicates the layer resulting from the process of only rapid thermal oxidization in $N_2O$ ambient. Referring to FIG. 5, by imposing current density of 1 mA/cm$^2$ on the fluorinated gate oxide of the gate area $1.76 \times 10^{-4}$ cm$^2$, the curve of Log[−ln(1−F)] of charge to breakdown of the oxide layer according to the present invention is shown, wherein F means failure rate.

From the above figure, fluorinated oxide layer resulting from the process of liquid phase deposition and then rapid thermal oxidization in $N_2O$ ambient has higher charge to breakdown than that from the process of only rapid thermal oxidization in $N_2O$ ambient.

As shown in FIG. 6, by imposing staircase current density of 1 mA/cm$^2$ on the fluorinated gate oxide of the gate area $1.76 \times 10^{-4}$ cm$^2$, the relation between gate voltage shift and constant current stress time is shown.

From FIG. 6, fluorinated oxide layer resulting from the process of liquid phase deposition and then rapid thermal oxidization in $N_2O$ ambient has lower gate voltage shift (due to constant current stress time) than that resulting from the process of only rapid thermal oxidization in $N_2O$.

Regarding FIG. 7, by imposing voltage (0.5 V and 1 second for every step) on fluorinated oxide layer of the gate area $1.76 \times 10^{-4}$ cm$^2$, when the gate current reaches $1 \times 10^{-6}$ A, the curve of Log[−ln(1−F)] of the oxide breakdown field of the fluorinated oxide layer is shown.

It can be clearly understood from FIG. 7 that the fluorinated oxide layer from the process of liquid phase deposition and then rapid thermal oxidization in $N_2O$ ambient has higher oxide breakdown field than that resulting from the process of only rapid thermal oxidization in $N_2O$.

Thus, according to the present invention, the fluorinated oxide layer resulting from the present method has excellent properties such as controllable fluorine content, high charge to breakdown and high breakdown field, etc.

While the above is a full description of the specific embodiment, various modifications, alternative constructions and equivalents may be used. Therefore, the above description and illustrations should not be taken as limiting the scope of the present invention which is defined by the appended claims.

What is claimed is:

1. A method for manufacturing a gate oxide layer containing fluorine, said method comprising steps of:

providing a substrate;

depositing a fluorinated oxide layer over said substrate; and oxidizing said fluorinated oxide layer at a high temperature.

2. The method of claim 1, before said depositing step further comprising a step of: flushing said substrate by a RCA solution.

3. The method of claim 1 wherein said depositing step is achieved by liquid phase deposition.

4. The method of claim 3 wherein said liquid phase deposition is obtained by immersing said substrate in a solution of over-saturated $H_2SiF_6$.

5. The method of claim 4 wherein said solution of over-saturated $H_2SiF_6$ is obtained by adding water into a solution of saturated $H_2SiF_6$.

6. The method of claim 4 wherein said solution of over-saturated $H_2SiF_6$ is obtained by adding boric acid into a solution of saturated $H_2SiF_6$.

7. The method of claim 1 wherein aluminum is added into said solution of over-saturated $H_2SiF_6$, thereby adding aluminum atoms into said fluorinated oxide layer.

8. The method of claim 1 wherein said depositing step is at a temperature of 20° C. to 100° C.

9. The method of claim 1, after said depositing step further comprising a step of: dipping said substrate in pure water.

10. The method of claim 1 wherein said oxidizing step is in a rapid thermal processor.

11. The method of claim 1 wherein said oxidizing step is in a quartz tube of a resistive furnace.

12. The method of claim 1 wherein said high temperature is over about 800° C..

13. The method of claim 1 wherein said oxidizing step is in an $O_2$ ambient.

14. The method of claim 1 wherein said oxidizing step is an $N_2O$ ambient.

15. The method of claim 1, after said oxidizing step further comprising a step: lowering the temperature of said substrate.

16. A method for manufacturing a gate oxide layer containing fluorine, said method comprising steps of:

providing a substrate;

growing a fluorinated oxide layer over said substrate by liquid phase deposition; and heating said substrate in a processor at a high temperature, thereby oxidizing said fluorinated oxide layer.

17. The method of claim 16, before said growing step further comprising a step of: flushing said substrate by a RCA solution.

18. The method of claim 16, after said heating step further comprising steps of:

lowering the temperature of said processor; and taking out said substrate from said processor.

19. The method of claim 16, after said growing step further comprising a step of: dipping said substrate in pure water.

20. The method of claim 16 whereto said high temperature is over about 800° C., said oxidizing step is in an oxygen or $N_2O$ ambient, said growing step is at a temperature of 20° C. to 100° C., and said processor is a rapid thermal processor.

* * * * *